(12) United States Patent
Tollefsbol et al.

(10) Patent No.: US 9,190,837 B2
(45) Date of Patent: Nov. 17, 2015

(54) RIGID FLEX ELECTROMAGNETIC PULSE PROTECTION DEVICE

(71) Applicant: Transtector Systems, Inc., Hayden, ID (US)

(72) Inventors: Trevor O. Tollefsbol, Hayden, ID (US); Eric Nguyen, Hayden, ID (US)

(73) Assignee: Transtector Systems, Inc., Hayden, ID (US)

( * ) Notice: Subject to any disclaimer, the term of this patent is extended or adjusted under 35 U.S.C. 154(b) by 417 days.

(21) Appl. No.: 13/886,639

(22) Filed: May 3, 2013

(65) Prior Publication Data
US 2013/0293997 A1    Nov. 7, 2013

Related U.S. Application Data

(60) Provisional application No. 61/642,238, filed on May 3, 2012.

(51) Int. Cl.
*H02H 9/00* (2006.01)
*H05K 9/00* (2006.01)

(52) U.S. Cl.
CPC ............. *H02H 9/005* (2013.01); *H05K 9/0037* (2013.01); *H05K 9/0066* (2013.01)

(58) Field of Classification Search
CPC ................................ H02H 9/00; H02H 9/005
USPC ......................................................... 361/789
See application file for complete search history.

(56) References Cited

U.S. PATENT DOCUMENTS

| | | |
|---|---|---|
| 2,030,179 A | 2/1936 | Potter |
| 3,167,729 A | 1/1965 | Hall |
| 3,323,083 A | 5/1967 | Ziegler |
| 3,596,165 A | 7/1971 | Andrews |
| 3,619,721 A | 11/1971 | Westendorp |
| 3,663,901 A | 5/1972 | Forney, Jr. |
| 3,731,234 A | 5/1973 | Collins |
| 3,750,053 A | 7/1973 | LeDonne |
| 3,783,178 A | 1/1974 | Philibert |
| 3,831,110 A | 8/1974 | Eastman |

(Continued)

FOREIGN PATENT DOCUMENTS

| | | |
|---|---|---|
| CH | 675933 | 11/1990 |
| JP | 08-066037 | 3/1996 |

(Continued)

*Primary Examiner* — Jenny L Wagner
*Assistant Examiner* — Michael P McFadden
(74) *Attorney, Agent, or Firm* — Snell & Wilmer LLP

(57) ABSTRACT

An EMP/HEMP protection device for protecting equipment from electromagnetic pulses. The protection device includes a housing defining a cavity therein and separated into two chambers, a dirty chamber for propagation of signals before filtering of electromagnetic interference, and a clean chamber, isolated from the dirty chamber, for propagation of signals after filtering. A rigid-flex printed circuit board (PCB) is disposed in the cavity for facilitating electrical connections between the chambers. Surface mount electrical components for EMP/HEMP protection are coupled with the rigid-flex PCB. Power and/or data signals are transferred from the dirty chamber to the clean chamber though a wave guide below cutoff (WBC). The WBC is formed from opposing electrical ground planes within a center PCB of the rigid-flex PCB. An electrically conductive and weather sealing gasket is disposed in the cavity of the housing for further EMI isolation.

14 Claims, 11 Drawing Sheets

(56) References Cited

U.S. PATENT DOCUMENTS

| | | |
|---|---|---|
| 3,832,627 A | 8/1974 | Ohsawa |
| 3,845,358 A | 10/1974 | Anderson et al. |
| 3,921,015 A | 11/1975 | Obeda et al. |
| 3,944,937 A | 3/1976 | Fujisawa et al. |
| 3,956,717 A | 5/1976 | Fisher et al. |
| 3,980,976 A | 9/1976 | Tadama et al. |
| 4,021,759 A | 5/1977 | Camp |
| 4,046,451 A | 9/1977 | Juds et al. |
| 4,047,120 A | 9/1977 | Lord et al. |
| 4,112,395 A | 9/1978 | Seward |
| 4,262,317 A | 4/1981 | Baumbach |
| 4,356,360 A | 10/1982 | Volz |
| 4,359,764 A | 11/1982 | Block |
| 4,384,331 A | 5/1983 | Fukuhara et al. |
| 4,409,637 A | 10/1983 | Block |
| 4,481,641 A | 11/1984 | Gable et al. |
| 4,554,608 A | 11/1985 | Block |
| 4,563,720 A | 1/1986 | Clark |
| 4,586,104 A | 4/1986 | Standler |
| 4,689,713 A | 8/1987 | Hourtane et al. |
| 4,698,721 A | 10/1987 | Warren |
| 4,727,350 A | 2/1988 | Ohkubo |
| 4,901,183 A | 2/1990 | Lee |
| 4,952,173 A | 8/1990 | Peronnet et al. |
| 4,984,146 A | 1/1991 | Black et al. |
| 4,985,800 A | 1/1991 | Feldman et al. |
| 5,053,910 A | 10/1991 | Goldstein |
| 5,057,964 A | 10/1991 | Bender et al. |
| 5,102,818 A | 4/1992 | Paschke et al. |
| 5,122,921 A | 6/1992 | Koss |
| 5,124,873 A | 6/1992 | Wheeler |
| 5,142,429 A | 8/1992 | Jaki |
| 5,166,855 A | 11/1992 | Turner |
| 5,170,151 A | 12/1992 | Hochstein |
| 5,278,720 A | 1/1994 | Bird |
| 5,321,573 A | 6/1994 | Persona et al. |
| 5,353,189 A | 10/1994 | Tomlinson |
| 5,412,526 A | 5/1995 | Kapp et al. |
| 5,442,330 A | 8/1995 | Fuller et al. |
| 5,534,768 A | 7/1996 | Chavannes et al. |
| 5,537,044 A | 7/1996 | Stahl |
| 5,611,224 A | 3/1997 | Weinerman et al. |
| 5,617,284 A | 4/1997 | Paradise |
| 5,625,521 A | 4/1997 | Luu |
| 5,667,298 A | 9/1997 | Musil et al. |
| 5,721,662 A | 2/1998 | Glaser et al. |
| 5,781,844 A | 7/1998 | Spriester et al. |
| 5,790,361 A | 8/1998 | Minch |
| 5,798,790 A | 8/1998 | Knox et al. |
| 5,844,766 A | 12/1998 | Miglioli et al. |
| 5,854,730 A | 12/1998 | Mitchell et al. |
| 5,943,225 A | 8/1999 | Park |
| 5,953,195 A | 9/1999 | Pagliuca |
| 5,963,407 A | 10/1999 | Fragapane et al. |
| 5,966,283 A | 10/1999 | Glaser et al. |
| 5,982,602 A | 11/1999 | Tellas et al. |
| 5,986,869 A | 11/1999 | Akdag |
| 6,026,458 A | 2/2000 | Rasums |
| 6,031,705 A | 2/2000 | Gscheidle |
| 6,054,905 A | 4/2000 | Gresko |
| 6,060,182 A | 5/2000 | Tanaka et al. |
| 6,061,223 A | 5/2000 | Jones et al. |
| 6,086,544 A | 7/2000 | Hibner et al. |
| 6,115,227 A | 9/2000 | Jones et al. |
| 6,137,352 A | 10/2000 | Germann |
| 6,141,194 A | 10/2000 | Maier |
| 6,177,849 B1 | 1/2001 | Barsellotti et al. |
| 6,226,166 B1 | 5/2001 | Gumley et al. |
| 6,236,551 B1 | 5/2001 | Jones et al. |
| 6,243,247 B1 | 6/2001 | Akdag et al. |
| 6,252,755 B1 | 6/2001 | Willer |
| 6,281,690 B1 | 8/2001 | Frey |
| 6,292,344 B1 | 9/2001 | Glaser et al. |
| 6,342,998 B1 | 1/2002 | Bencivenga et al. |
| 6,381,283 B1 | 4/2002 | Bhardwaj et al. |
| 6,385,030 B1 | 5/2002 | Beene |
| 6,394,122 B1 | 5/2002 | Sibley et al. |
| 6,421,220 B2 | 7/2002 | Kobsa |
| 6,502,599 B1 | 1/2003 | Sibley et al. |
| 6,527,004 B1 | 3/2003 | Sibley et al. |
| 6,535,369 B1 | 3/2003 | Redding et al. |
| 6,650,203 B2 | 11/2003 | Gerstenberg et al. |
| 6,721,155 B2 | 4/2004 | Ryman |
| 6,754,060 B2 | 6/2004 | Kauffman |
| 6,757,152 B2 | 6/2004 | Galvagni et al. |
| 6,782,329 B2 | 8/2004 | Scott |
| 6,785,110 B2 | 8/2004 | Bartel et al. |
| 6,789,560 B1 | 9/2004 | Sibley et al. |
| 6,814,100 B1 | 11/2004 | Sibley et al. |
| 6,816,348 B2 | 11/2004 | Chen et al. |
| 6,968,852 B1 | 11/2005 | Sibley |
| 6,975,496 B2 | 12/2005 | Jones et al. |
| 7,082,022 B2 | 7/2006 | Bishop |
| 7,092,230 B2 | 8/2006 | Inauen |
| 7,104,282 B2 | 9/2006 | Hooker et al. |
| 7,106,572 B1 | 9/2006 | Girard |
| 7,130,103 B2 | 10/2006 | Murata |
| 7,159,236 B2 | 1/2007 | Abe et al. |
| 7,221,550 B2 | 5/2007 | Chang et al. |
| 7,250,829 B2 | 7/2007 | Namura |
| 7,338,547 B2 | 3/2008 | Johnson et al. |
| 7,371,970 B2 | 5/2008 | Flammer et al. |
| 7,430,103 B2 | 9/2008 | Kato |
| 7,453,268 B2 | 11/2008 | Lin |
| 7,471,172 B2 | 12/2008 | Holst et al. |
| 7,507,105 B1 | 3/2009 | Peters et al. |
| 7,623,332 B2 | 11/2009 | Frank et al. |
| 7,675,726 B2 | 3/2010 | Bolz et al. |
| 7,808,752 B2 | 10/2010 | Richiuso et al. |
| 7,817,398 B1 | 10/2010 | Maples |
| 2002/0167302 A1 | 11/2002 | Gallavan |
| 2002/0191360 A1 | 12/2002 | Colombo et al. |
| 2003/0072121 A1 | 4/2003 | Bartel et al. |
| 2003/0151870 A1 | 8/2003 | Gronbach et al. |
| 2003/0179533 A1 | 9/2003 | Jones et al. |
| 2003/0211782 A1 | 11/2003 | Esparaz et al. |
| 2004/0042149 A1 | 3/2004 | Devine et al. |
| 2004/0121648 A1 | 6/2004 | Voros |
| 2004/0145849 A1 | 7/2004 | Chang et al. |
| 2004/0264087 A1 | 12/2004 | Bishop |
| 2005/0036262 A1 | 2/2005 | Siebenthall et al. |
| 2005/0044858 A1 | 3/2005 | Hooker et al. |
| 2005/0176275 A1 | 8/2005 | Hoopes et al. |
| 2005/0185354 A1 | 8/2005 | Hoopes |
| 2005/0206482 A1 | 9/2005 | DuToit et al. |
| 2006/0038635 A1 | 2/2006 | Richiuso et al. |
| 2006/0044076 A1 | 3/2006 | Law |
| 2006/0082946 A1 | 4/2006 | Duenez et al. |
| 2006/0120005 A1 | 6/2006 | Van Sickle |
| 2006/0139832 A1 | 6/2006 | Yates et al. |
| 2006/0146458 A1 | 7/2006 | Mueller |
| 2007/0053130 A1 | 3/2007 | Harwath |
| 2007/0095400 A1 | 5/2007 | Bergquist et al. |
| 2007/0097583 A1 | 5/2007 | Harwath |
| 2007/0139850 A1 | 6/2007 | Kamel et al. |
| 2008/0170346 A1 | 7/2008 | Van Swearingen |
| 2009/0103226 A1 | 4/2009 | Penwell et al. |
| 2009/0109584 A1 | 4/2009 | Jones et al. |
| 2009/0284888 A1 | 11/2009 | Bartel et al. |
| 2009/0296430 A1 | 12/2009 | Rieux-Lopez et al. |
| 2011/0080683 A1 | 4/2011 | Jones et al. |
| 2011/0141646 A1 | 6/2011 | Jones et al. |
| 2011/0159727 A1 | 6/2011 | Howard et al. |
| 2011/0279943 A1 | 11/2011 | Penwell et al. |
| 2012/0006593 A1* | 1/2012 | Tillotson .......... H05K 9/005 174/377 |

FOREIGN PATENT DOCUMENTS

| | | |
|---|---|---|
| JP | 11-037400 | 2/1999 |
| JP | 2003-070156 | 3/2003 |
| JP | 2003-111270 | 4/2003 |
| KR | 10-2003-0081041 | 10/2003 |

(56) References Cited

FOREIGN PATENT DOCUMENTS

| KR | 1020090018497 | 2/2009 |
|----|---------------|--------|
| WO | WO 95/10116 | 4/1995 |
| WO | WO 2011-119723 | 12/2011 |

\* cited by examiner

RIGID FLEX ELECTROMAGNETIC PULSE PROTECTION DEVICE

CROSS REFERENCE TO RELATED APPLICATIONS

This application claims the benefit and priority of U.S. Provisional Application No. 61/642,238, entitled RIGID FLEX ELECTROMAGNETIC PULSE PROTECTION DEVICE, filed on May 3, 2012, the entire contents of which are hereby incorporated by reference herein.

BACKGROUND

1. Field

The present disclosure relates generally to protection circuits or devices for electrical equipment and improvements thereof. More particularly, the present disclosure relates to electromagnetic or high altitude electromagnetic pulse protection circuits or devices for electrical systems or equipment and improvements thereof.

2. Description of the Related Art

Communications equipment, computer systems and a variety of other electronic devices are vulnerable to damage or operational interference from electromagnetic pulses ("EMP") or high altitude electromagnetic pulses ("HEMP"). These vulnerabilities can threaten proper operation for a wide variety of both military and commercial applications. Electronic devices impacted by such electrical pulses can be expensive to repair or replace and, therefore, a cost effective way to protect these devices and components is needed. One such effort for reducing or eliminating these problems involves connection of an EMP/HEMP protection device to the equipment, systems or other devices sought to be protected. By filtering or otherwise manipulating one or more electrical signals that propagate to the protected equipment, systems or devices via the EMP/HEMP protection device, the harmful electrical pulses may be diminished before they have an opportunity to interfere with system operations.

Unfortunately, conventional EMP/HEMP protection designs suffer from a variety of undesirable problems. Traditional design and manufacturing methods for EMP/HEMP protection devices involves the use of a feed-through capacitor or other circuit components assembled onto printed circuit boards ("PCBs") via conductive pins that extend into and are received via receptacles on the PCBs. Due to this manufacturing design, electrical connections between the PCBs and the capacitive or other circuit components needed for pulse protection results in increased failure rates at these unstable connection points. These problems are often exacerbated by blind mating during the manufacturing process where the mating of components with the PCBs cannot be seen or felt prior or during securement in order to ensure correct alignment of the various parts. Use of pin and receptacle coupling methods, particularly as electrical parts are further reduced in size and sturdiness, results in increased susceptibility for failure at these connection points due to shock and/or vibration. This is of particular concern in military-grade applications which are commonly required to withstand harsher environmental conditions than their consumer-grade counterparts. Furthermore, feed-through capacitance construction additionally limits the available space of the protection device for housing or accommodating other protection circuitry components.

Therefore, an EMP/HEMP protection device or apparatus that is easier to manufacture and utilizes fewer or more stable connections is desired for increasing the mean time between failures ("MTBF") of the device or apparatus. An ideal EMP/HEMP protection device would have increased reliability due to improved manufacturability or assembly design and encounter lower manufacturing costs, both in initial construction and in repair or replacement as a result of lessened return merchandise authorization ("RMA") requests. The ideal EMP/HEMP protection device or apparatus would be capable of electrically isolating electromagnetic interference ("EMI") from signals input or transmitted to the device.

SUMMARY

An apparatus and method for protecting systems or devices from electromagnetic pulses or high altitude electromagnetic pulses by directing such pulses through isolated chambers of a housing or an enclosure via rigid-flex printed circuit boards is described. In one implementation, an electromagnetic pulse protection apparatus may include a housing defining a cavity therein and a first rigid printed circuit board coupled with the housing and disposed within the cavity for separating the cavity into a first portion and a second portion. A second rigid printed circuit board is coupled with the housing and disposed within the first portion of the cavity. A first signal port is coupled to the housing and electrically connected with the second rigid printed circuit board, the first signal port configured to receive an input signal. A first flexible printed circuit board is disposed in the first portion of the cavity and electrically connected between the first rigid printed circuit board and the second rigid printed circuit board. A third rigid printed circuit board is coupled with the housing and disposed within the second portion of the cavity. A second signal port is coupled to the housing and electrically connected with the third rigid printed circuit board, the second signal port configured to output an output signal. A second flexible printed circuit board is disposed in the second portion of the cavity and electrically connected between the first rigid printed circuit board and the third rigid printed circuit board.

In another implementation, an electromagnetic pulse protection apparatus may include a housing defining a cavity therein, the cavity having a first portion and a second portion separated from the first portion by an isolating wall. A first rigid printed circuit board may be coupled with the housing and disposed within both the first portion and the second portion of the cavity. A second rigid printed circuit board may be coupled with the housing and disposed only within the first portion of the cavity. A first signal port may be coupled to the housing and electrically connected with the second rigid printed circuit board, the first signal port configured to receive an input signal. A first flexible printed circuit board may be disposed only within the first portion of the cavity and electrically connected between the first rigid printed circuit board and the second rigid printed circuit board. A third rigid printed circuit board may be coupled with the housing and disposed only within the second portion of the cavity. A second signal port may be coupled to the housing and electrically connected with the third rigid printed circuit board, the second signal port configured to output an output signal. A second flexible printed circuit board may be disposed only within the second portion of the cavity and electrically connected between the first rigid printed circuit board and the third rigid printed circuit board.

BRIEF DESCRIPTION OF THE DRAWINGS

Other systems, methods, features, and advantages of the present disclosure will be or will become apparent to one with skill in the art upon examination of the following figures and detailed description. It is intended that all such additional systems, methods, features, and advantages be included within this description, be within the scope of the present disclosure, and be protected by the accompanying claims. Component parts shown in the drawings are not necessarily to scale, and may be exaggerated to better illustrate the important features of the present disclosure. In the drawings, like reference numerals designate like parts throughout the different views, wherein:

DETAILED DESCRIPTION

Figure 1A:
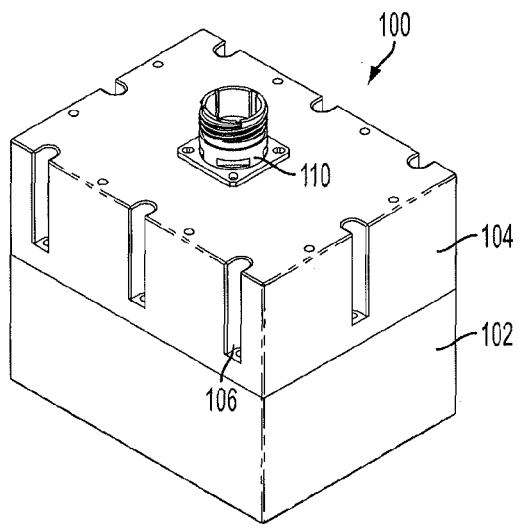
FIG. 1A is an exterior perspective view of an electromagnetic pulse protection device according to an implementation of the present disclosure.
Figure 1B:
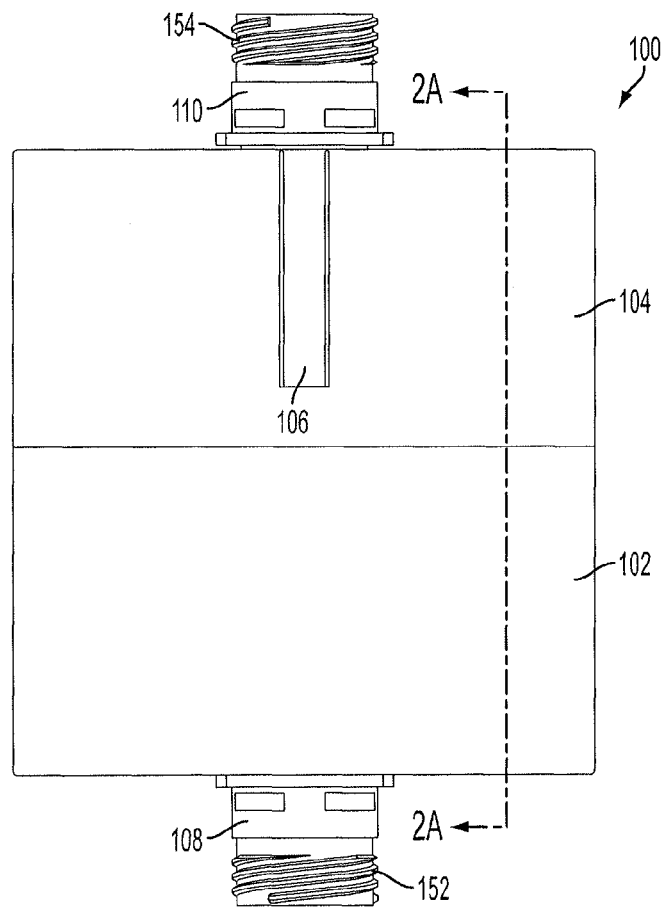
FIG. 1B is an exterior side view of the electromagnetic pulse protection device of FIG. 1A according to an implementation of the present disclosure.

Referring first to FIGS. 1A and 1B, an exterior perspective view and an exterior side view of an electromagnetic pulse ("EMP") protection device 100 are shown. The EMP protection device 100 operates to eliminate or reduce the propagation of electromagnetic pulses along a transmission path to systems or equipment desired to be protected. A first housing piece 102 and a second housing piece 104 mate together in order to form a stable enclosure of the EMP protection device 100 in order to contain various electrical components and structural features therein, as described in greater detail below. A plurality of slots 106 are disposed in the second housing piece 104 in order to more easily accommodate a screwdriver or other equipment used for securing the first housing piece 102 and the second housing piece 104 together (e.g., using screws).

The EMP protection device 100 includes a first signal port 108 coupled to the first housing piece 102 and operating as an input port. Similarly, the EMP protection device 100 also includes a second signal port 110 coupled to the second housing piece 104 and operating as an output port. The EMP protection device 100 may thus be connected in-line along a transmission path from a power and/or signal source to a protected piece of equipment such that a signal on the transmission path may enter the EMP protection device 100 via the first signal port 108, propagate along or through various electrical components within the EMP protection device 100, as discussed in more detail herein, and exit the EMP protection device 100 via the second signal port 110 for transmission to the protected piece of equipment. The first signal port 108 and/or the second signal port 110 may include threaded portions (152, 154) to aid in securing the EMP protection device 100 to a transmission line or other connector. In an alternative implementation, any of a variety of connection methods may be used.

Figure 2A:
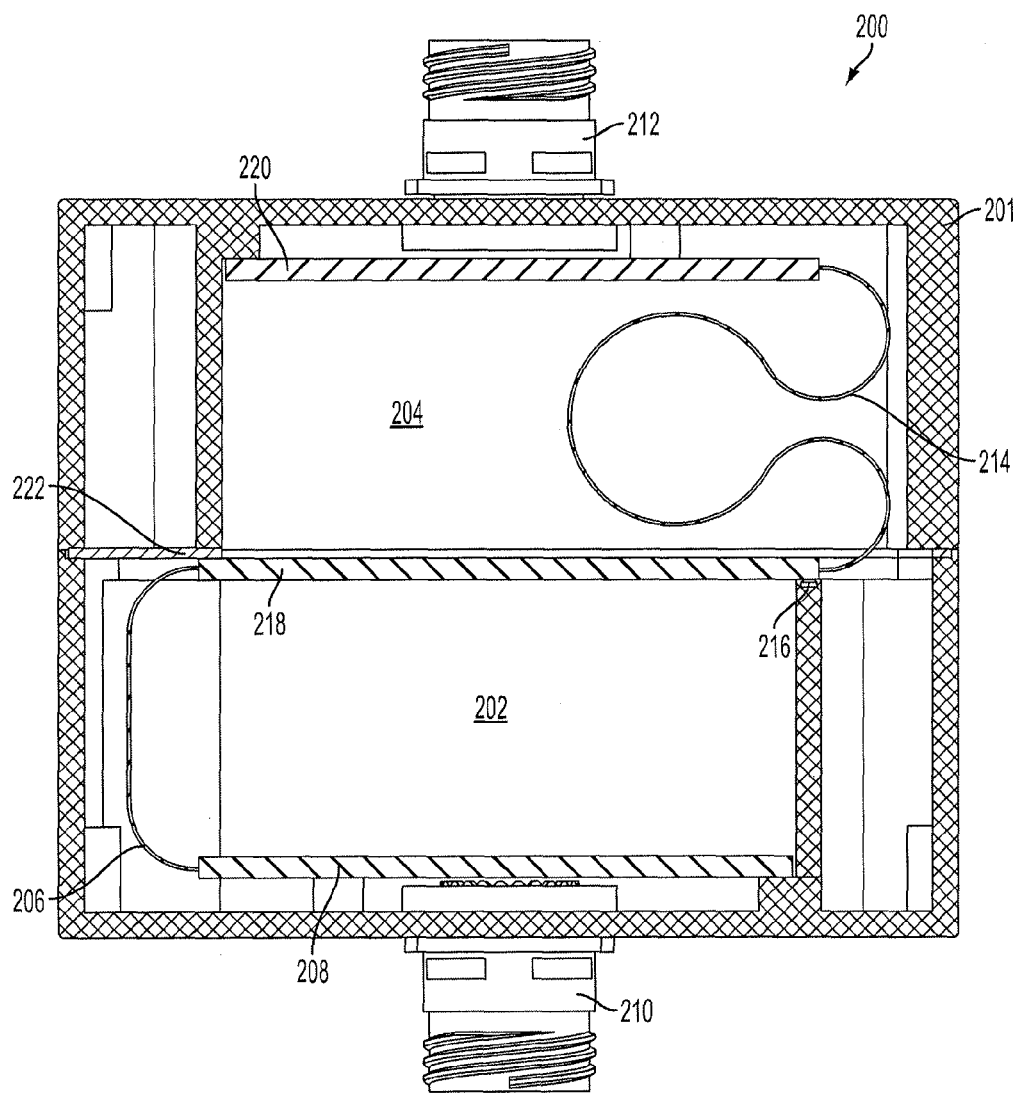
FIG. 2A is a cut-away side view of an electromagnetic pulse protection device utilizing a rigid-flex printed circuit board in a parallel dual-chamber split configuration according to an implementation of the present disclosure.

Turning next to FIG. 2A, a cut-away side view of an EMP protection device 200 is shown, which may correspond to the 2A-2A line in FIG. 1B. The EMP protection device 200 may be the same as or similar to the EMP protection device 100 previously described. The EMP protection device 200 includes an enclosure 201 and a first signal or connection port 210 (e.g., an input port) coupled to the enclosure 201. A second signal or connection port 212 (e.g., an output port) is also coupled to the enclosure 201. The enclosure 201 defines a cavity therein, divided into first and second portions or chambers (202, 204), as described in greater detail herein. The first portion 202 and the second portion 204 have one or more circuit components disposed therein, as discussed in greater detail herein, and are connected with the first signal port 210 and/or the second signal port 212. Thus, an electrical signal received on the first signal port 210 may pass through the one or more circuit components within the cavity of the enclosure 201 and output on the second signal port 212.

The first portion 202 may be configured to be a "dirty chamber" wherein an electrical signal propagating within the first portion 202 after entering the EMP protection device 200 has not yet been fully filtered. For example, the electrical signal may contain signal components or characteristics due to electromagnetic interference ("EMI") when propagating within the first portion 202 of the cavity of the enclosure 201. The second portion 204 may be configured to be a "clean chamber" wherein an electrical signal propagating within the second portion 204 has already been filtered or otherwise modified so as to remove the above mentioned signal components (e.g., signal components or characteristics due to EMI). The first portion 202 and the second portion 204 are electrically isolated or shielded from one another (e.g., via a ground bond to the housing) in order to prevent signal components (e.g., EMI) from propagating from the first signal port 210 to the second signal port 212 and exposing any connected equipment to such undesirable signal characteristics. Both the first portion 202 and the second portion 204 are also electrically isolated or shielded from the outside environment surrounding the EMP protection device 200.

A rigid-flex printed circuit board ("PCB") is disposed within the cavity of the enclosure 201, at least a part of the rigid-flex PCB positioned to define or separate the first portion 202 from the second portion 204. The rigid-flex PCB includes a first rigid PCB 218, a second rigid PCB 208 and a third rigid PCB 220. The first rigid PCB 218 is positioned and configured so as to form a physical barrier separating the first portion 202 from the second portion 204. Thus, the EMP protection device 200 utilizes portions (202, 204) of the cavity that are split in a parallel configuration with the first rigid PCB 218. A sealing EMI gasket 222 is coupled with the first rigid PCB 218 and configured to aid in separating the first portion 202 from the second portion 204 in order to prevent leakage of EMI from one portion of the cavity to the other. The sealing EMI gasket 222 may also be coupled or otherwise received by a portion of the enclosure 201 via an EMI gasket channel 216. Thus, the gasket securely forms a physical boundary from around a perimeter of the second rigid PCB 218 to an interior surface of the enclosure 201. The sealing EMI gasket 222 may be made of a variety of conductive materials, for example copper or other metal. The sealing EMI gasket 222 may be an electrically conductive weather sealing gasket for helping prevent environmental containments from entering the enclosure 201 and interfering with its operational performance.

A first flexible PCB 206 electrically connects the first rigid PCB 218 and the second rigid PCB 208. A second flexible PCB 214 electrically connects the first rigid PCB 218 and the third rigid PCB 220. In an alternative implementation, the first flexible PCB 206 and/or the second flexible PCB 214 may be other bendable or flexible elements capable of conducting signals therealong. The second flexible PCB 214 may be substantially longer than the first flexible PCB 206. In FIG. 2A, the first flexible PCB 206 has a length corresponding to a minimum length required to connect the first rigid PCB 218 with the second rigid PCB 220, allowing for a minimal amount of slack. The second flexible PCB 214 may be longer, such as twice as long as a distance between the first rigid PCB 218 and the third rigid PCB 220, to increase a surface area of the second flexible PCB 214. Because the second flexible PCB 214 is flexible, the excess length may be folded or shaped into a cylindrical loop or bubble shape, which extends into the second portion 204.

As shown, the second rigid PCB 208 is disposed in the first portion 202 adjacent to the first signal port 210 and electrically connected to conductors of the first signal port 210. Likewise, the third rigid PCB 220 is disposed in the second portion 204 adjacent to the second signal port 212 and electrically connected to conductors of the second signal port 212. Surface-mount circuit components (e.g., capacitors) may thus be coupled to any of the rigid PCBs (208, 218, 220) and positioned in either the first portion 202 or second portion 204 as necessary to desirably filter electrical signals without transmitting EMI characteristics to signals output on the second signal port 212, as discussed in greater detail herein. A waveguide below cutoff (WBC) may also be integrated with the first rigid PCB 218 to for improved filtering while attenuating EMI characteristics, as will be discussed in greater detail with respect to FIGS. 6A and 6B. Utilizing such a rigid-flex PCB can thus reduce or eliminate through-hole and/or PCB-to-PCB connections responsible for increased risk of failure and/or reduce the amount of hardware required for a particular EMP protection assembly.

The various rigid PCBs (208, 218, 220) may be mechanically fastened to interior surfaces of the enclosure 201, for example with screws. Alternative fasteners may additionally or replaceably be used, such as snap-fit or press-fit components, adhesives, etc. Greater or fewer rigid or flexible PCBs may be utilized in alternative implementations and such components may be of varying lengths, sizes or configurations in order to accommodate the desired circuit components disposed within the a particularly sized enclosure. While the EMP protection device 200 is shown with the first rigid PCB 218 and the sealing EMI gasket 222 for creating a physical barrier between the first chamber 202 and the second chamber 204, alternative implementations may incorporate greater or fewer elements, for example the enclosure 201 may include a wall for separating the first portion 202 from the second portion 204.

Figure 2B:
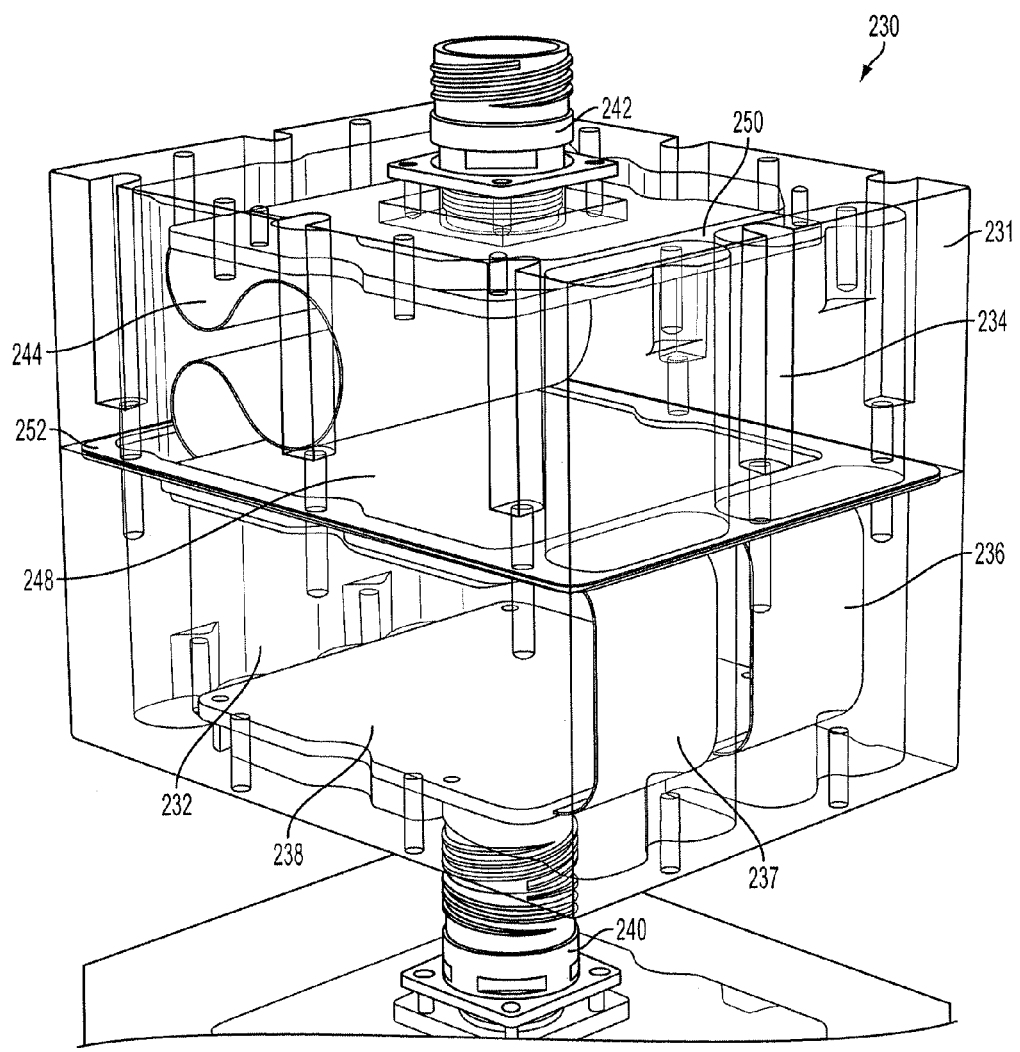
FIG. 2B is a transparent perspective view of an electromagnetic pulse protection device utilizing a rigid-flex printed circuit board in a parallel dual-chamber split configuration according to an implementation of the present disclosure.

Turning next to FIG. 2B, a transparent perspective view of an EMP protection device 230 is shown and demonstrates a configuration using three flexible circuit boards, as discussed in greater detail below. The EMP protection device 230 may be the same as or similar to EMP protection devices previously discussed. The EMP protection device 230 includes a first signal port 240 and a second signal port 242 coupled to an enclosure or housing 231 defining a cavity therein. Within the enclosure 231, a first rigid circuit board 248 is placed substantially in the center of the cavity and operates to separate a first portion 232 of the cavity from a second portion 234 of the cavity. A second rigid circuit board 238, disposed within the first portion 232, is connected with the first rigid circuit board 248 via a plurality of flexible circuit boards (236, 237). A third rigid circuit board 250, disposed within the second portion 234, is also connected with the first rigid circuit board 248 via a flexible circuit board 244.

Similar to the previous discussion, the second rigid circuit board 238 is electrically connected with one or more conductors of the first signal port 240 and is positioned substantially parallel with a surface of the enclosure 231 that couples with the first signal port 240. Likewise, the third rigid circuit board 250 is electrically connected with one or more conductors of the second signal port 242 and is positioned substantially parallel with a surface of the enclosure 231 that couples with the second signal port 242. The first rigid circuit board 248 is positioned as a boundary between the first portion 232 and the second portion 234. Similar to the previous discussion, a gasket 252 for helping prevent EMI leakage between the portions (232, 234) of the cavity is coupled with or otherwise surrounds a perimeter of the first rigid circuit board 248. The first rigid circuit board 248 may also include a WBC to prevent EMI leakage.

Greater or fewer flexible circuit boards may be utilized in an alternative implementation. For example, only one flexible circuit board may be used to connect the first rigid circuit board 248 and the second rigid circuit board 238. Various circuit components (e.g., resistors, capacitors, inductors, etc.) may be incorporated onto surfaces of the flexible circuit boards (236, 237, 244) or may otherwise mount to the flexible circuit boards (236, 237, 244) for filtering or otherwise manipulating an electrical signal as it propagates from the first signal port 240 to the second signal port 242. The flexible circuit boards (236, 237, 244) may thus be formed in a variety of lengths, sizes or configurations in order to adequately conduct or transmit electrical signals between their respective rigid circuit boards (238, 248, 250). As shown, the flexible circuit board 244 is formed to substantially exhibit a circular configuration or "bubble" between the first rigid circuit board 248 and the third rigid circuit board 250. This configuration may allow for improved heat dissipation for circuit elements disposed on the flexible circuit board 244 and/or provide increased surface area of the flexible circuit board 244 for incorporation of a greater number or greater separation between components connected or mounted thereon.

Figure 2C:
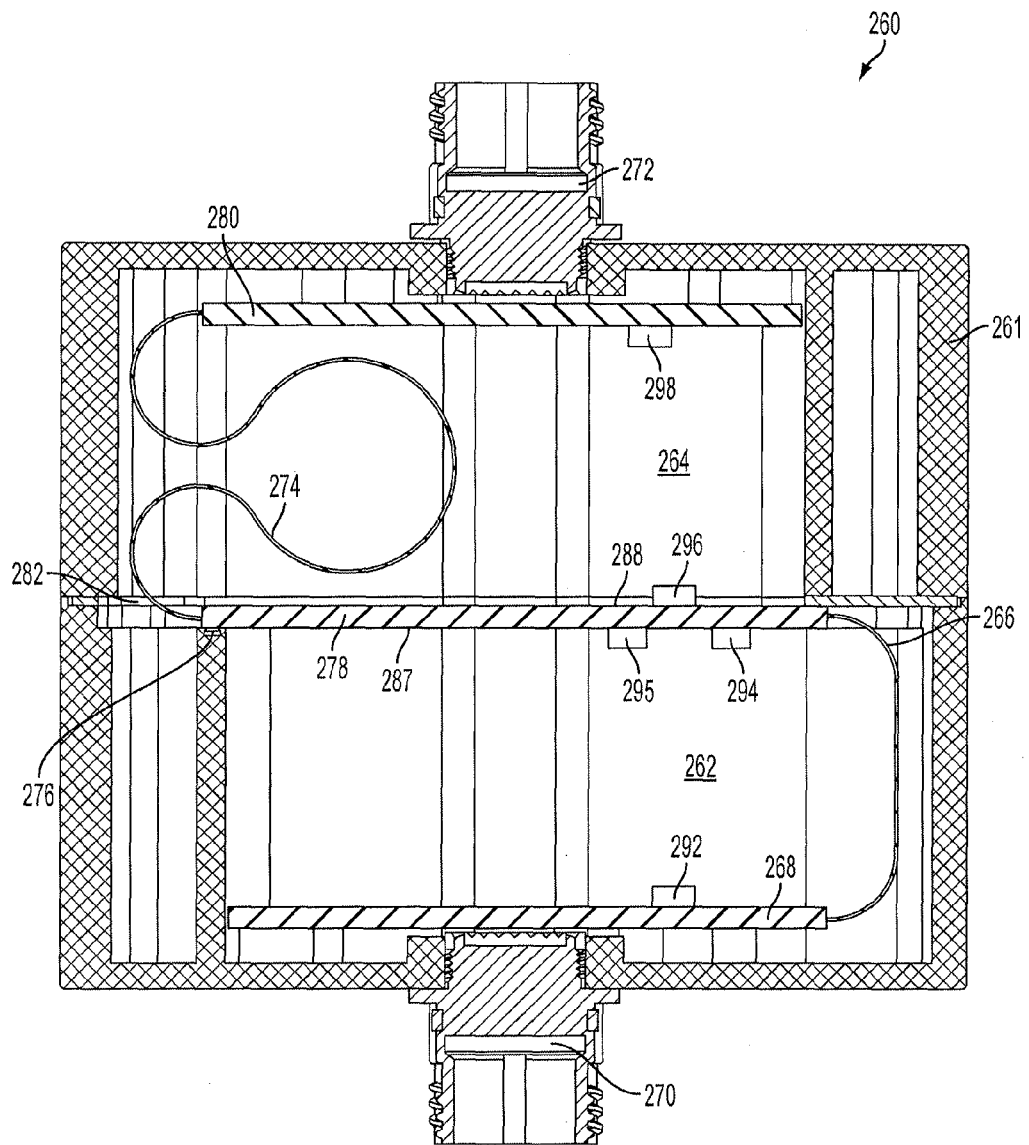
FIG. 2C is a cut-away side view of an electromagnetic pulse protection device utilizing a rigid-flex printed circuit board in a parallel dual-chamber split configuration according to an implementation of the present disclosure.

FIG. 2C shows a cut-away side view of an EMP protection device 260 and demonstrates a variety of surface-mount circuit elements included therein, as discussed in greater detail below. The EMP protection device 260 may be the same as or similar to EMP protection devices previously discussed. A first signal port 270 is coupled with a first surface of an enclosure 261 defining a cavity therein. A second signal port 272 is coupled with a second surface of the enclosure 261. A first portion 262 of the cavity is isolated or separated from a second portion 264 of the cavity via the placement of a rigid-flex PCB within the enclosure 261 that includes a first rigid PCB 278, a second rigid PCB 268, a third rigid PCB 280, a first flexible PCB 266 and a second flexible PCB 274, the same as or similar to the discussion above. Additionally, an EMI sealing gasket 282 and corresponding EMI gasket channel 276 are disposed in the cavity of the enclosure 261 for helping maintain EMI isolation, the same as or similar to the discussion above.

By utilizing the first rigid PCB 278 as a barrier PCB between the first and second portions (262, 264) of the cavity, circuit components may be mounted on one or more opposing surfaces of the first rigid PCB 278 and be disposed within the separated portions (262, 264) of the cavity in the enclosure 261. Thus, a first surface 287 of the first rigid PCB 278 may couple with surface-mount circuit components for their placement within the first portion 262 of the cavity, while a second surface 288 of the first rigid PCB 278 may be coupled with surface mount circuit components for their placement within the second portion 264 of the cavity. For example, surface-mount circuit components (294, 295) (e.g., capacitors, resistors, inductors, etc.) are shown mounted to the first surface 287 of the first rigid PCB 278 and thus completely disposed within the first portion 262. Similarly, a surface-mount circuit component 296 (e.g., capacitor, resistor, inductor, etc.) is shown mounted to the second surface 288 of the first rigid PCB 278 and thus completely disposed within the second portion 264. The first rigid PCB 278 may also include a WBC instead of or in addition to the surface-mount circuit components (294, 295).

Similarly, a surface-mount circuit component 292 is shown mounted to the second rigid PCB 268 and thus completely disposed within the first chamber 262 and a surface mount circuit component 298 is shown mounted to the third rigid PCB 280 and thus completely disposed within the second chamber 264. Thus, surface-mount circuit components may be used in place of traditional feed-through components, eliminating or reducing failure points in the EMP protection device 260. In an alternative implementation, greater or fewer circuit components may be mounted or otherwise electrically connected with any of the surfaces of the rigid circuit boards (268, 278, 280). In yet another alternative implementation, circuit components may be mounted or otherwise electrically connected with any of the surfaces of the flexible circuit boards (266, 274).

Figure 3A:
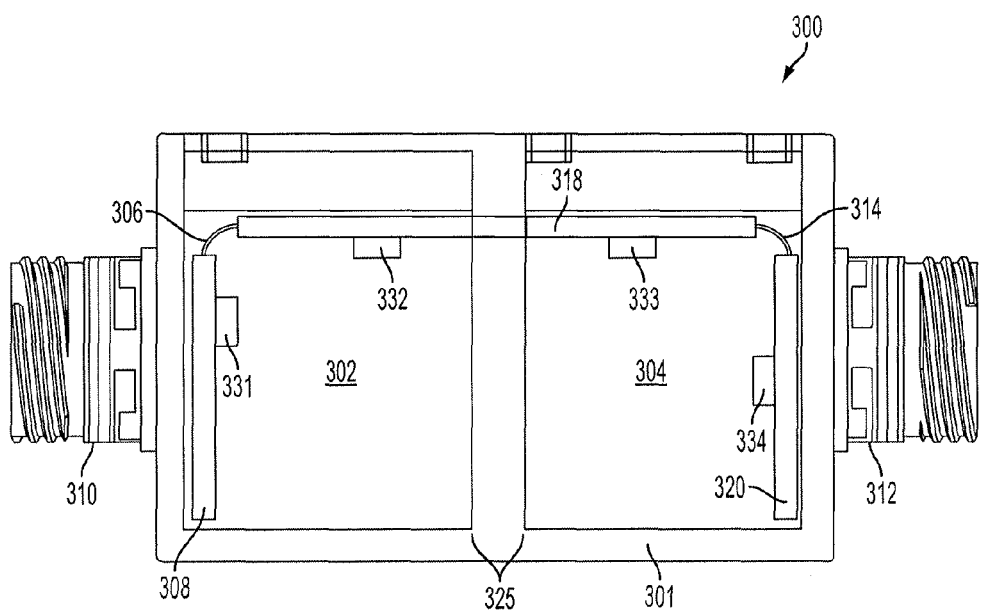
FIG. 3A is a cut-away side view of an electromagnetic pulse protection device utilizing a rigid-flex printed circuit board in a perpendicular dual-chamber split configuration according to an implementation of the present disclosure.

FIG. 3A shows a cut-away side view of an EMP protection device 300 and demonstrates a dual-chamber configuration formed via an enclosure 301 of the EMP protection device 300. Certain aspects of the EMP protection device 300 may be the same as or similar to EMP protection devices previously discussed. A first signal port 310 is coupled to the enclosure 301 and a second signal port 312 is coupled to the enclosure 301. The enclosure 301 defines two chambers (302, 304) within via a separating wall 325. The first chamber 302 is thus electrically isolated from the second chamber 304, similar to the previous discussion.

A rigid-flex PCB including a first rigid PCB 318, a second rigid PCB 308 and a third rigid PCB 320 are disposed within one or more of the first chamber 302 and/or the second chamber 304. As shown, the second rigid PCB 308 is positioned within the first chamber 302, the third rigid PCB 320 is positioned within the second chamber 304 and the first rigid PCB 318 is positioned or extending within both the first chamber 302 and the second chamber 304. A first flexible PCB 306 electrically connects the first rigid PCB 318 to the second rigid PCB 308 within the first chamber 302 and a second flexible PCB 314 electrically connects the first rigid PCB 318 to the third rigid PCB 320 within the second chamber 304. Thus, the EMP protection device 300 utilizes chambers (302, 304) that are split in a perpendicular configuration with the first rigid PCB 318. Surface-mount circuit components (331, 332, 333, 334) are coupled with surfaces of the rigid circuit boards (308, 318, 320), similar to the discussions above. The first rigid PCB 318 may also include a WBC, as will be described below. Such a perpendicular chambered configuration may allow for use of a single-sided printed circuit board for the first rigid PCB 318 and/or improved EMI isolation between the chambers (302, 304) without additional EMI gaskets, but at potentially more expensive manufacturing costs for the enclosure 301 or for assembly of the first rigid PCB 318 within the enclosure 301.

Figure 3B:
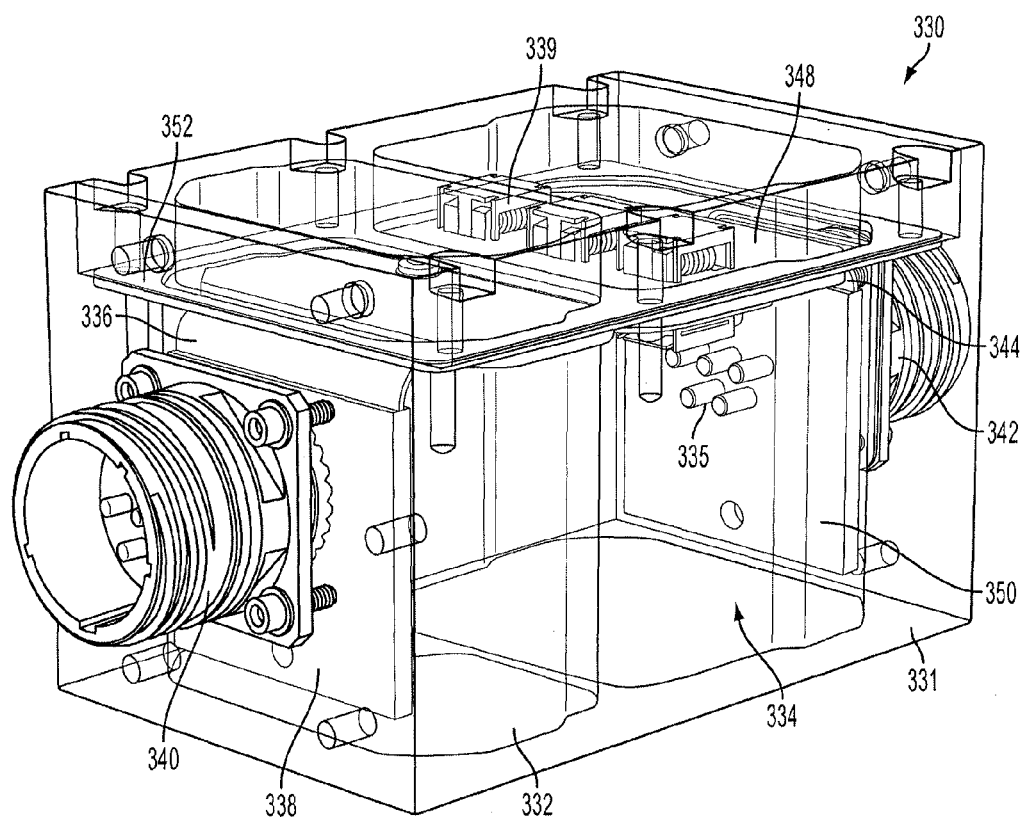
FIG. 3B is a transparent perspective view of an electromagnetic pulse protection device utilizing a rigid-flex printed circuit board in a perpendicular dual-chamber split configuration according to an implementation of the present disclosure.

Turning next to FIG. 3B, a transparent perspective view of an EMP protection device 330 is shown and demonstrates a configuration using an EMI gasket for electrically isolating interior chambers of the EMP protection device 330 from an exterior environment. The EMP protection device 330 may be the same as or similar to EMP protection devices previously discussed. The EMP protection device 330 includes a first signal port 340 and a second signal port 342 coupled to an enclosure or housing 331 defining a plurality of chambers therein. Within the enclosure 331, a first chamber 332 is separated or isolated from a second chamber 334. A first rigid circuit board 348 is coupled within the enclosure 331 and extends in both the first chamber 332 and the second chamber 334. A second rigid circuit board 338, disposed within the first chamber 332 and substantially perpendicular to the first rigid circuit board 348, is connected with the first rigid circuit board 348 via a flexible circuit board 336. A third rigid circuit board 350, disposed within the second chamber 334 and substantially perpendicular to the first rigid circuit board 348, is also connected with the first rigid circuit board 348 via a flexible circuit board 344. A plurality of surface-mount circuit components (335, 339) are shown disposed on a variety of circuit board surfaces, the same as or similar to discussion above. In addition, an EMI gasket 352 for providing additional protection against EMI leakage from or to any of the first chamber 332 or the second chamber 334 may be coupled with and surrounding a perimeter of the first rigid circuit board 348. A WBC may also be integrated with the first rigid circuit board 348.

Figure 3C:
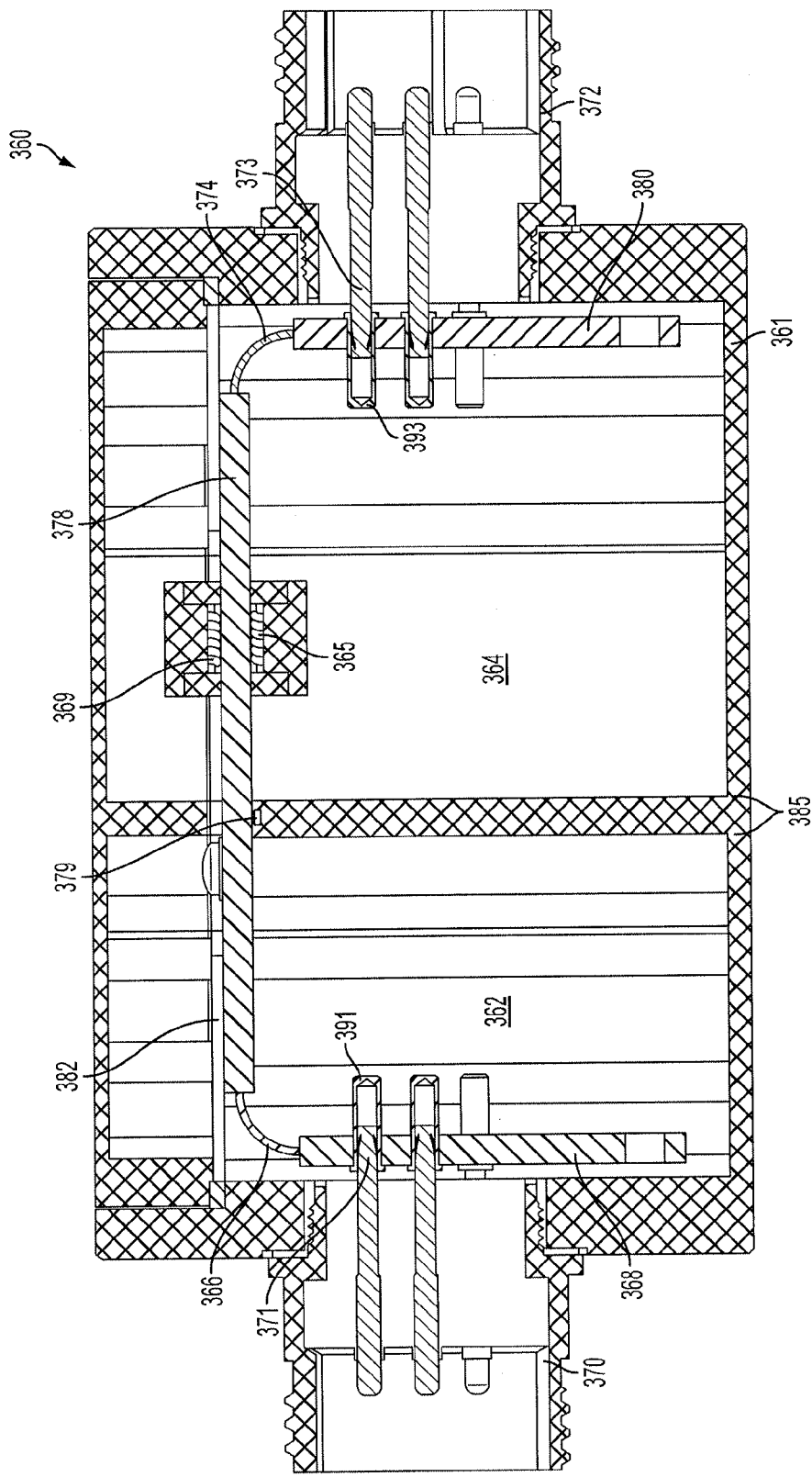
FIG. 3C is a cut-away side view of an electromagnetic pulse protection device utilizing a rigid-flex printed circuit board in a perpendicular dual-chamber split configuration according to an implementation of the present disclosure.

FIG. 3C shows a cut-away side view of an EMP protection device 360 and demonstrates electrical connection of signal ports to rigid PCBs within an enclosure 361, as discussed in greater detail below. The EMP protection device 360 may be the same as or similar to EMP protection devices previously discussed. A first signal port 370 is coupled with a first surface of the enclosure 361 defining a plurality of chambers therein via a barrier wall 385. The enclosure 361 and the barrier wall 385 define a first chamber 362 and a second chamber 364, although more chambers may be defined in alternative implementations. A second signal port 372 is coupled with a second surface opposing the first surface of the enclosure 361. A rigid-flex PCB is disposed within the enclosure 361 and includes a first rigid PCB 378, a second rigid PCB 368, a third rigid PCB 380, a first flexible PCB 366 and a second flexible PCB 374, the same as or similar to the discussion above. The first rigid PCB 378 may interface or cooperate with a PCB holding element 379 that is coupled with the enclosure 361 (e.g., a clip or fastener) for securing the first rigid PCB 378 in a stable position within the enclosure 361. Additionally, an EMI sealing gasket 382 in the enclosure 361 is provided for helping maintain EMI isolation with environments exterior to the enclosure 361, the same as or similar to the discussion above. The first rigid PCB 378 may also include a WBC.

The second rigid PCB 368 is coupled with a plurality of conductive sockets or pockets 391 (e.g., made of copper or other metal material) that is electrically connected with signal pathways printed on the second rigid PCB 368. The first signal port 370 includes a plurality of pins 371 that extend into the corresponding sockets 391 of the second rigid PCB 368 for providing an electrical connection between the first signal port 370 and the second rigid PCB 368. Similarly, third rigid PCB 380 is coupled with a plurality of conductive sockets or pockets 393 (e.g., made of copper or other metal material) that is electrically connected with signal pathways printed on the third rigid PCB 380. The second signal port 372 includes a plurality of pins 373 that extend into the corresponding sockets 393 of the third rigid PCB 380 for providing an electrical connection between the first signal port 372 and the third rigid PCB 380. A plurality of surface-mount circuit components (365, 369) are disposed within the enclosure 361 and coupled with the first rigid PCB 378. Although the circuit components (365, 369) are shown mounted on opposite surfaces of the first rigid PCB 378, in an alternative implementation only one surface of the first rigid PCB 378 may be used for coupling with circuit components.

Figure 4A:
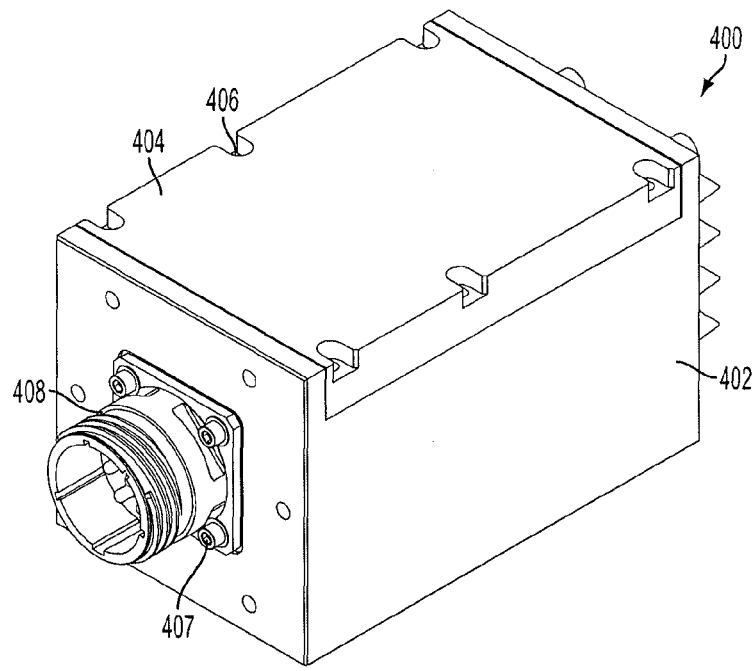
FIG. 4A is an exterior perspective view of an electromagnetic pulse protection device utilizing a terminal block connection port according to an implementation of the present disclosure.
Figure 4B:
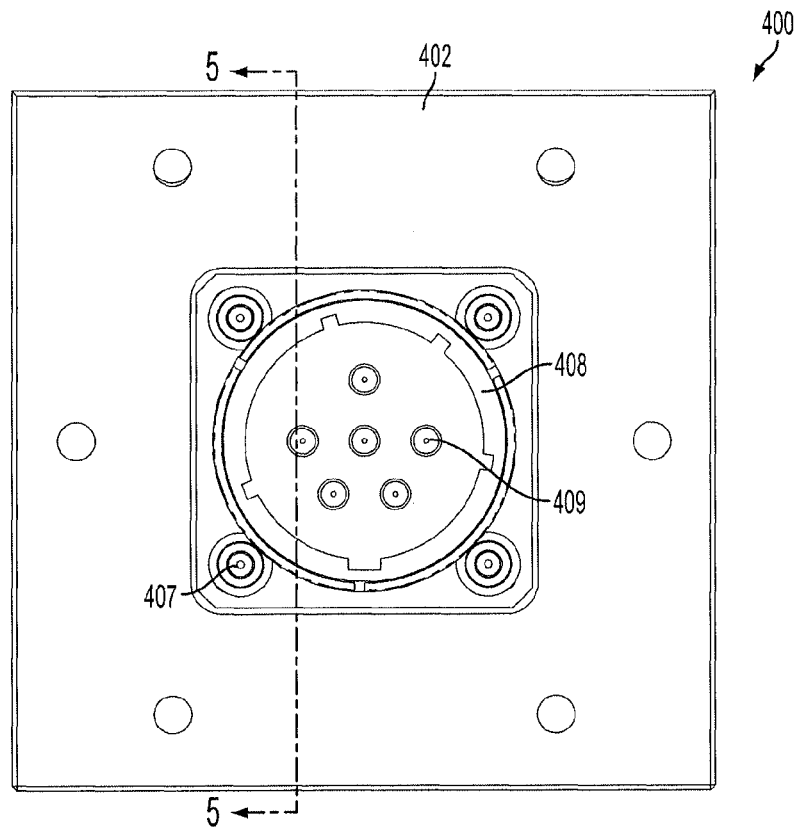
FIG. 4B is an exterior front view of the electromagnetic pulse protection device of FIG. 4A according to an implementation of the present disclosure.

FIG. 4A shows an exterior perspective view of an EMP protection device 400 with a terminal block connection port. The EMP protection device 400 may be the same as or similar to EMP protection devices previously discussed. The EMP protection device 400 includes a housing 402 configured to receive or engage with a lid 404 having a plurality of openings 406 for aiding in securing the housing 402 with the lid 404 via fasteners (e.g., screws). A connection port 408 is shown coupled with the housing 402 via a plurality of fasteners 407 (e.g., screws). FIG. 4B shows a front view of the connection port 408 of the EMP protection device 400 secured with the housing 402 and demonstrates a plurality of pins 409 of the connection port 408 for electrical connection with a printed circuit board or other conductive component within the housing 402.

Figure 5:
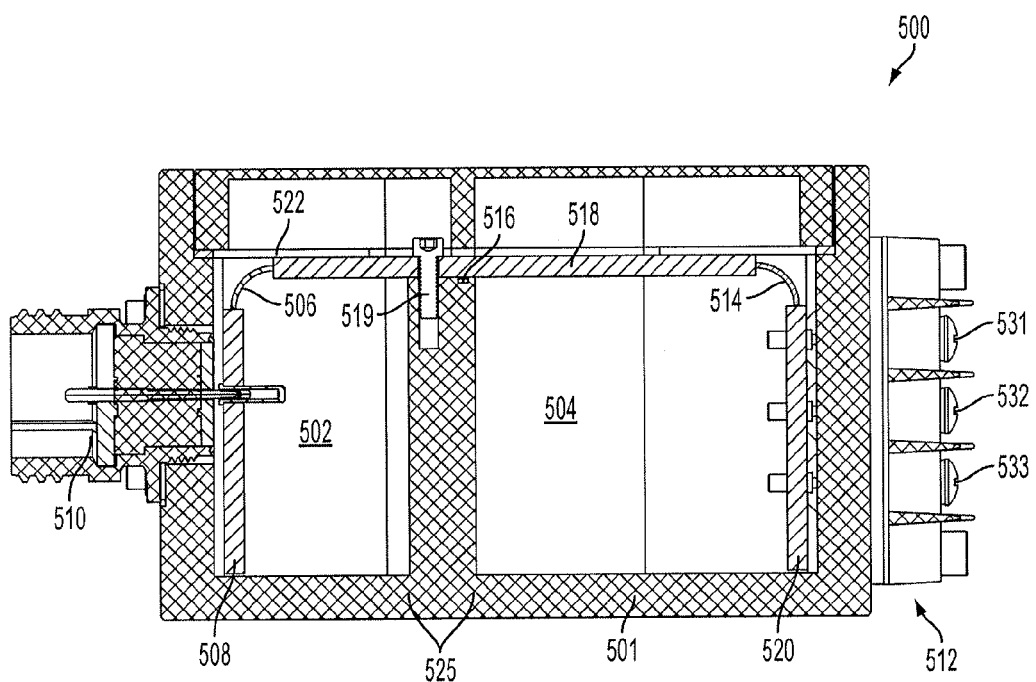
FIG. 5 is a cut-away side view of an electromagnetic pulse protection device utilizing a terminal block connection port and a rigid-flex printed circuit board in a perpendicular dual-chamber split configuration according to an implementation of the present disclosure.

FIG. 5 shows a cut-away side view of an EMP protection device 500 utilizing a terminal block connection port, corresponding to the 5-5 line in FIG. 4B. The EMP protection device 500 may be the same as or similar to EMP protection devices previously discussed. The EMP protection device 500 includes a housing 501 defining a first chamber 502 and a second chamber 504 via a barrier wall 525. A three-part rigid-flex PCB is positioned within the housing 501 and includes a first rigid PCB 518 secured with the housing 501 via a PCB holding element 519, a second rigid PCB 508, a third rigid PCB 520, a first flexible PCB 506 connecting the first rigid PCB 518 to the second rigid PCB 508 and a second flexible PCB 514 connecting the first rigid PCB 518 to the third rigid PCB 520. A first connection port 510 (e.g., a rounded connector with a plurality of pins) is electrically connected with the second rigid PCB 508. A second connection port 512 (e.g., a terminal block) has a plurality of screw-terminal connections (e.g., a first terminal 531, a second terminal 532 and a third terminal 533) electrically connected with the third rigid PCB 520. In an alternative implementation, any of a variety of connection types or numbers of conductive elements thereon may be utilized for any of the connection ports. Similar to previously discussed implementations, the EMP protection device 500 includes a weather sealing EMI gasket 522 coupled with the first rigid PCB 518 and the housing 501, and an EMI gasket channel 516. The first rigid PCB 518 may also include a WBC.

Figure 6A:
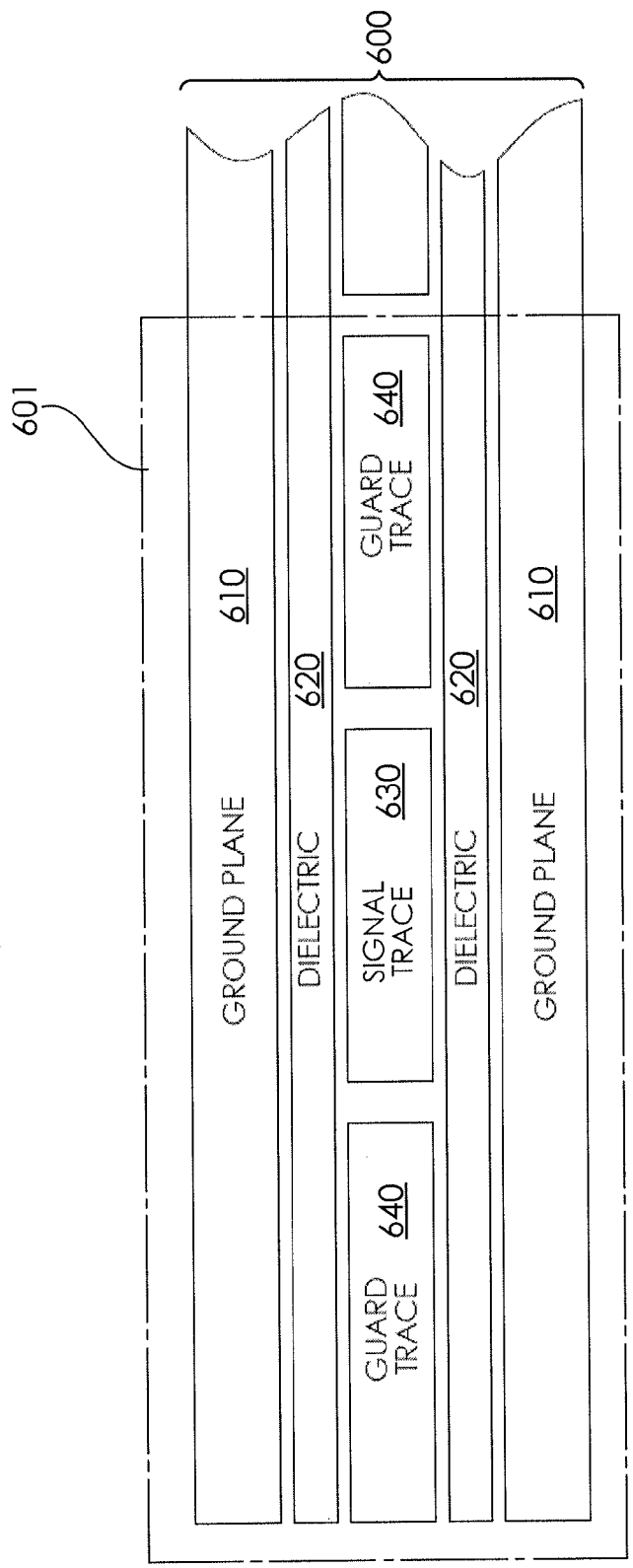
FIG. 6A is a cut-away side view of a waveguide below cutoff within a printed circuit board according to an implementation of the present disclosure.
Figure 6B:
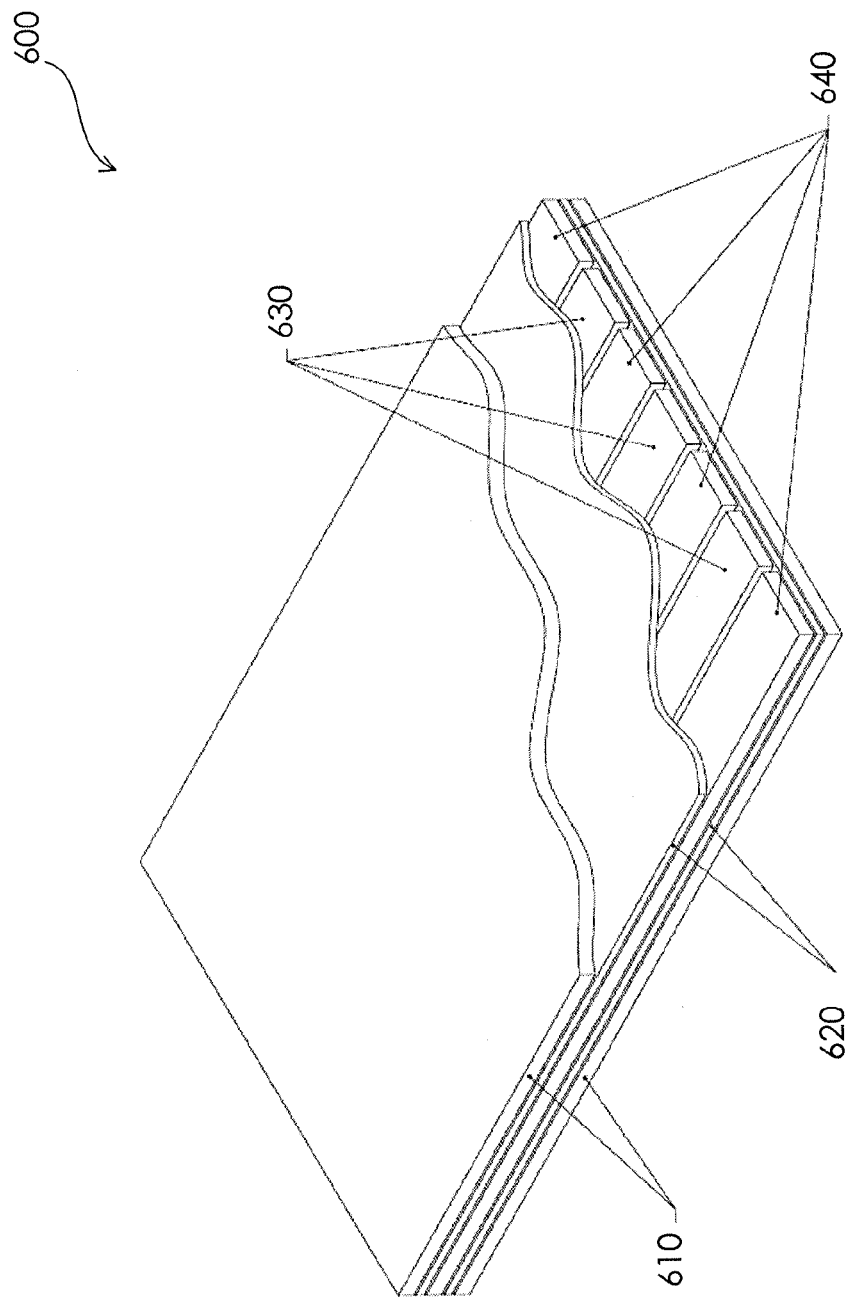
FIG. 6B is an isometric view of the waveguide below cutoff according to an implementation of the present disclosure.

Turning to FIGS. 6A and 6B, FIGS. 6A and 6B depict a WBC 600 according to one implementation of the present disclosure. The inner layers of a PCB 601 form a WBC 600, which may be directly adjacent to the physical mechanical barrier feature within the main enclosure, such as the separating wall 325 in FIG. 3A, the barrier wall 385 in FIG. 3C, or the barrier wall 525 in FIG. 5. The PCB 601 may correspond to the first rigid PCBs of the rigid-flex PCBs, such as the first rigid PCB 218, the first rigid circuit board 248, the first rigid PCB 278, the first rigid PCB 318, the first rigid circuit board 348, the first rigid PCB 378, and/or the first rigid PCB 518. Because the WBC 600 is integrated with the first rigid PCB of the rigid-flex PCBs, the WBC 600 provides the only path between the dirty and clean chambers for the operating signals.

The WBC 600 includes two ground planes 610, which are substantially parallel. Two dielectric layers 620 are sandwiched between the two ground planes 610, and are also substantially parallel with each other and with the two ground planes 610. Sandwiched between the two dielectric layers 620 are signal traces 630 and guard traces 640. The signal traces 630 and the guard traces 640 are arranged in an alternating pattern, although other implementations may utilize alternative arrangements.

The WBC 600 is a combination of mechanical and electrical filters. As a mechanical filter, the physical dimensions of the ground planes 610 and the guard traces 640 that surround the signal traces 630 are designed to attenuate all the undesirable radiated frequencies according to the requirements of the specific application. The cutoff frequency of the WBC 600 correlates to the ratio of the width of the WBC 600, (i.e. the distance between the guard traces 640) to the respective length of the WBC 600 (i.e. the total distance for which the signal traces are contained between the two ground planes 610). The length of the WBC 600 is generally at least four times greater than its width, although in other implementations the ratio may vary as needed. As an electrical filter, the dielectric constant between the two ground planes 610 and insulating layers of the PCB 601 act as a capacitor, designed to work in tandem with lump reactive elements in the circuit to attenuate undesirable frequencies.

Conventional design solutions for egress between isolated EMI chambers utilize feed-through capacitors. However, the WBC 600 advantageously provides better signal integrity, impedance control over the entire length of the signal transmission line, improved mechanical reliability from shocks and vibrations due to the elimination of the interconnect to the discrete feed-through components, less total component count and smaller total implementation size and volume which also improves cost-effectiveness, and more control over the range or band of frequencies that require attenuation.

The EMP protection device implementations described above may be modified or alternatively designed with different, additional, or fewer circuit or structural elements to achieve the same or similar isolation functionality as described above. Alternative connector ports or methods may be employed for electrically connecting an EMP protection device with an electrical pathway to equipment or systems to be protected. The EMP protection device may be configured for ranges of typical or commonly expected EMP, HEMP or EMI signal levels or may be designed and constructed as a custom configuration to meet a particular system or setup.

Exemplary implementations of the disclosure have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such implementations that reasonably fall within the scope of the advancement to the art hereby contributed, and that that scope shall not be restricted, except in light of the appended claims and their equivalents.

What is claimed is:

1. An electromagnetic pulse protection apparatus comprising:
    a housing defining a cavity therein;
    a first rigid printed circuit board (PCB) connected to the housing and disposed within the cavity for separating the cavity into a first portion and a second portion;
    a second rigid PCB connected to the housing and disposed within the first portion of the cavity;
    a first signal port connected to the housing and electrically connected with the second rigid PCB, the first signal port configured to receive an input signal;
    a first flexible PCB disposed in the first portion of the cavity and electrically connected between the first rigid PCB and the second rigid PCB;
    a third rigid PCB connected to the housing and disposed within the second portion of the cavity;
    a second signal port connected to the housing and electrically connected with the third rigid PCB, the second signal port configured to output an output signal; and
    a second flexible PCB disposed in the second portion of the cavity and electrically connected between the first rigid PCB and the third rigid PCB.

2. The electromagnetic pulse protection apparatus of claim 1, wherein inner layers of the first rigid PCB form a waveguide below cutoff (WBC) comprising a plurality of alternating signal traces and guard traces sandwiched between two substantially parallel ground planes.

3. The electromagnetic pulse protection apparatus of claim 1, wherein the second flexible PCB is longer than a distance between the first rigid PCB and the third rigid PCB.

4. The electromagnetic pulse protection apparatus of claim 1, wherein the second flexible PCB forms a loop shape.

5. The electromagnetic pulse protection apparatus of claim 1, further comprising a capacitor connected to the first rigid printed circuit board, the second rigid printed circuit board or the third rigid printed circuit board via a surface mount electrical connection.

6. The electromagnetic pulse protection apparatus of claim 1, wherein the first portion of the cavity is configured to contain signals before filtering for electromagnetic interference and the second portion of the cavity is configured to contain signals after filtering for electromagnetic interference.

7. The electromagnetic pulse protection apparatus of claim 1, further comprising a conductive gasket positioned substantially around a perimeter of the first rigid printed circuit board for preventing EMI leakage between the first portion and the second portion.

8. An electromagnetic pulse protection apparatus comprising:
    an enclosure comprising a first housing defining a first chamber therein and a second housing connected to the first housing and defining a second chamber therein;
    a first rigid printed circuit board (PCB) connected to the enclosure and disposed within the enclosure for separating the first chamber and the second chamber;
    a sealing EMI gasket disposed substantially around a perimeter of the first rigid PCB;
    an EMI gasket channel connected to the sealing EMI gasket;
    a second rigid PCB connected to the enclosure and disposed within the first chamber;
    a first signal port connected to the enclosure and electrically connected with the second rigid PCB, the first signal port configured to receive an input signal;
    a first flexible PCB disposed in the first chamber and electrically connected between the first rigid PCB and the second rigid PCB;
    a third rigid PCB connected to the enclosure and disposed within the second chamber;
    a second signal port connected to the enclosure and electrically connected with the third rigid PCB, the second signal port configured to output an output signal; and
    a second flexible PCB disposed in the second chamber and electrically connected between the first rigid PCB and the third rigid PCB.

9. The electromagnetic pulse protection apparatus of claim 8, wherein the first rigid PCB further comprises a waveguide below cutoff (WBC) comprising:
    a plurality of signal traces;
    a plurality of guard traces, the plurality of signal traces alternating with the plurality of signal traces along a plane;
    a first dielectric layer substantially parallel to the plane;
    a second dielectric layer substantially parallel to the plane, the plurality of signal traces and the plurality of guard traces sandwiched between the first and second dielectric layers;
    a first ground plane substantially parallel to the plane; and
    a second ground plane substantially parallel to the plane, the first and second dielectric layers sandwiched between the first and second ground planes.

10. The electromagnetic pulse protection apparatus of claim 8, further comprising a third flexible PCB disposed in the first chamber and electrically connected between the first rigid PCB and the second rigid PCB.

11. The electromagnetic pulse protection apparatus of claim 8, wherein the second housing has a plurality of slots for a plurality of fasteners to connect the second housing to the first housing.

12. The electromagnetic pulse protection apparatus of claim 8, wherein the enclosure further defines a plurality of chambers within the first housing and the second housing.

13. The electromagnetic pulse protection apparatus of claim 8, wherein the EMI gasket channel is disposed within the first housing.

14. The electromagnetic pulse protection apparatus of claim 8, further comprising a surface mount circuit component mounted on a surface of the first, second, or third rigid PCBs or the first or second flexible PCBs.

* * * * *